US 7,649,410 B2

(12) United States Patent
Andersen et al.

(10) Patent No.: US 7,649,410 B2
(45) Date of Patent: Jan. 19, 2010

(54) SYSTEMS AND METHODS FOR IMPROVING PERFORMANCE IN A DIGITAL AMPLIFIER BY ADDING AN ULTRASONIC SIGNAL TO AN INPUT AUDIO SIGNAL

(75) Inventors: Jack B. Andersen, Cedar Park, TX (US); Peter G. Craven, Thakeham (GB)

(73) Assignee: D2Audio Corporation, Milpitas, CA (US)

( * ) Notice: Subject to any disclaimer, the term of this patent is extended or adjusted under 35 U.S.C. 154(b) by 62 days.

(21) Appl. No.: 11/626,569

(22) Filed: Jan. 24, 2007

(65) Prior Publication Data

US 2007/0170984 A1    Jul. 26, 2007

Related U.S. Application Data

(60) Provisional application No. 60/761,614, filed on Jan. 24, 2006.

(51) Int. Cl.
    *H03F 3/38* (2006.01)
(52) U.S. Cl. .......................................... 330/10; 330/251
(58) Field of Classification Search .................... 330/10, 330/251, 207 A
    See application file for complete search history.

(56) References Cited

U.S. PATENT DOCUMENTS

| 5,247,581 | A | | 9/1993 | Gurcan |
| 5,389,829 | A | | 2/1995 | Milazzo |
| 5,548,286 | A | | 8/1996 | Craven |
| 5,551,067 | A | | 8/1996 | Hulkko et al. |
| 5,594,386 | A | | 1/1997 | Dhuyvetter |
| 5,789,975 | A | * | 8/1998 | Yoshida et al. ................. 330/10 |
| 5,974,089 | A | * | 10/1999 | Tripathi et al. ............... 375/247 |
| 6,140,875 | A | * | 10/2000 | Van Den Homberg et al. ........................... 330/251 |
| 6,294,957 | B1 | * | 9/2001 | Luu ........................... 330/251 |
| 6,362,683 | B1 | * | 3/2002 | Miao et al. ..................... 330/10 |

(Continued)

FOREIGN PATENT DOCUMENTS

EP         0 534 804 A         3/1993

OTHER PUBLICATIONS

Estes et al., "A FPGA-Based Approach to the Digital Control of a Class-D Amplifier for Sound Applications," Power Electronics Specialists Conference, 2005. PESC '05. IEEE 36th, Jun. 16, 2005, pp. 122-126.

(Continued)

*Primary Examiner*—Henry K Choe
(74) *Attorney, Agent, or Firm*—Fliesler Meyer LLP

(57) ABSTRACT

Systems and methods in which an ultrasonic signal is introduced into an audio signal before the audio signal is amplified by a switching amplifier. The added ultrasonic signal (e.g., a tone at half the amplifier's switching frequency) shifts the signals input to a set of power switches so that they do not switch nearly simultaneously. The ultrasonic signal causes the output current to be well defined to eliminate dead time distortion at low signal levels. Adding the tone ultrasonic signal causes the distortion to shift to an amplitude greater than zero. Signals that exceed this amplitude will experience the distortion, but the distortion will be less noticeable than in lower-amplitude signals. Signals that do not exceed this amplitude will not experience the distortion at all. Adding an ultrasonic signal may also draw energy away from the switch frequency and its harmonics to interference with AM radio reception.

33 Claims, 10 Drawing Sheets

Switching amplifier with modifier

U.S. PATENT DOCUMENTS

| | | |
|---|---|---|
| 6,373,336 B1 | 4/2002 | Anderskouv et al. |
| 2004/0100328 A1 | 5/2004 | Melanson |

OTHER PUBLICATIONS

International Search Report mailed Jan. 15, 2008, in connection with PCT/US07/60984, 4 pages.

Supplementary European Search Report mailed Jan. 27, 2009, in connection with EP 07717387, 7 pages.

Supplementary European Search Report mailed Jan. 27, 2009, in connection with EP 07717387, 7 pages.

European Examination Report mailed Jun. 5, 2009, in connection with EP 07717387, 4 pages.

* cited by examiner

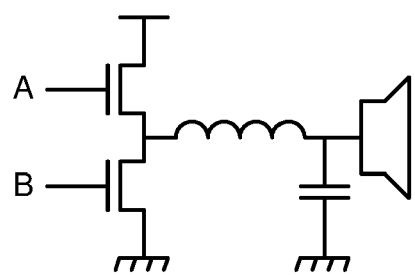
Figure 1
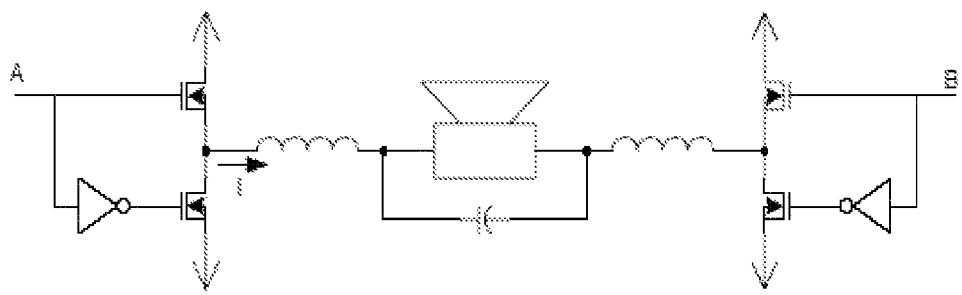
Figure 2
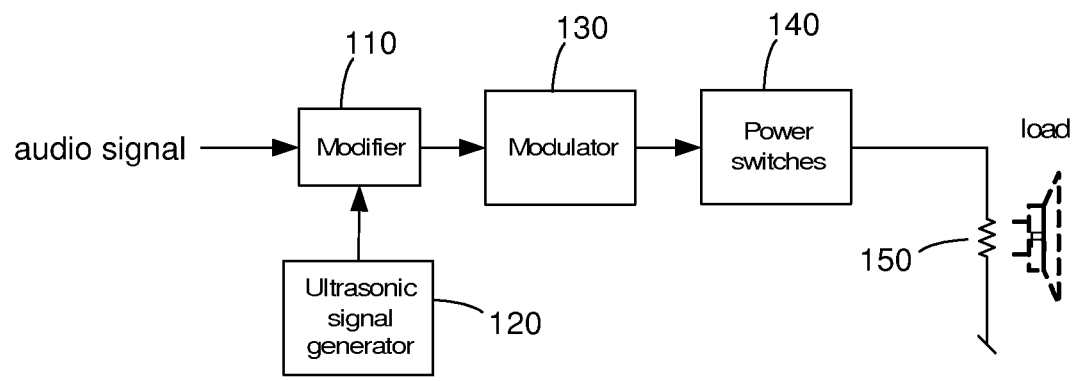
Figure 3 : Switching amplifier with modifier

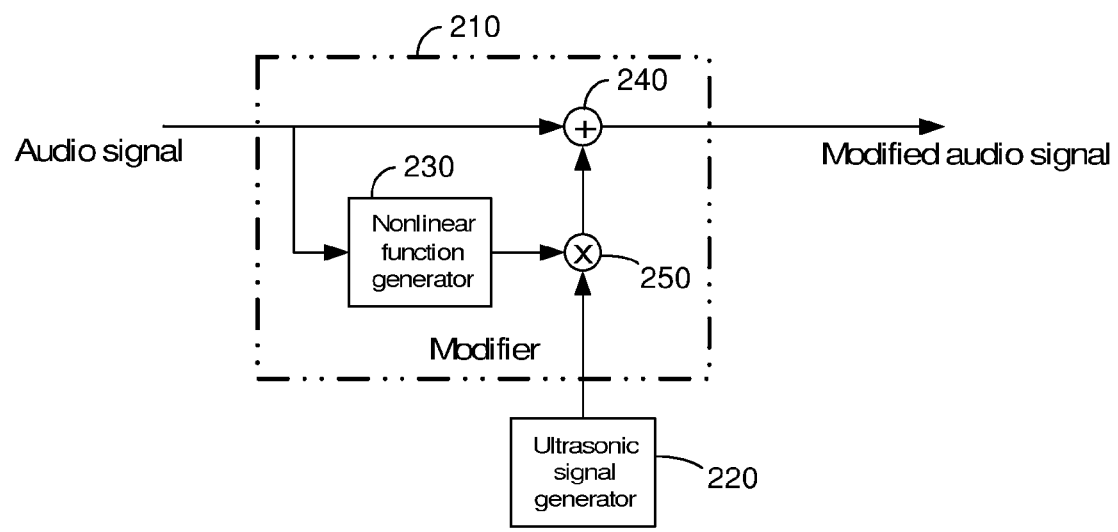
Figure 4 : Modifier comprising nonlinear function generator
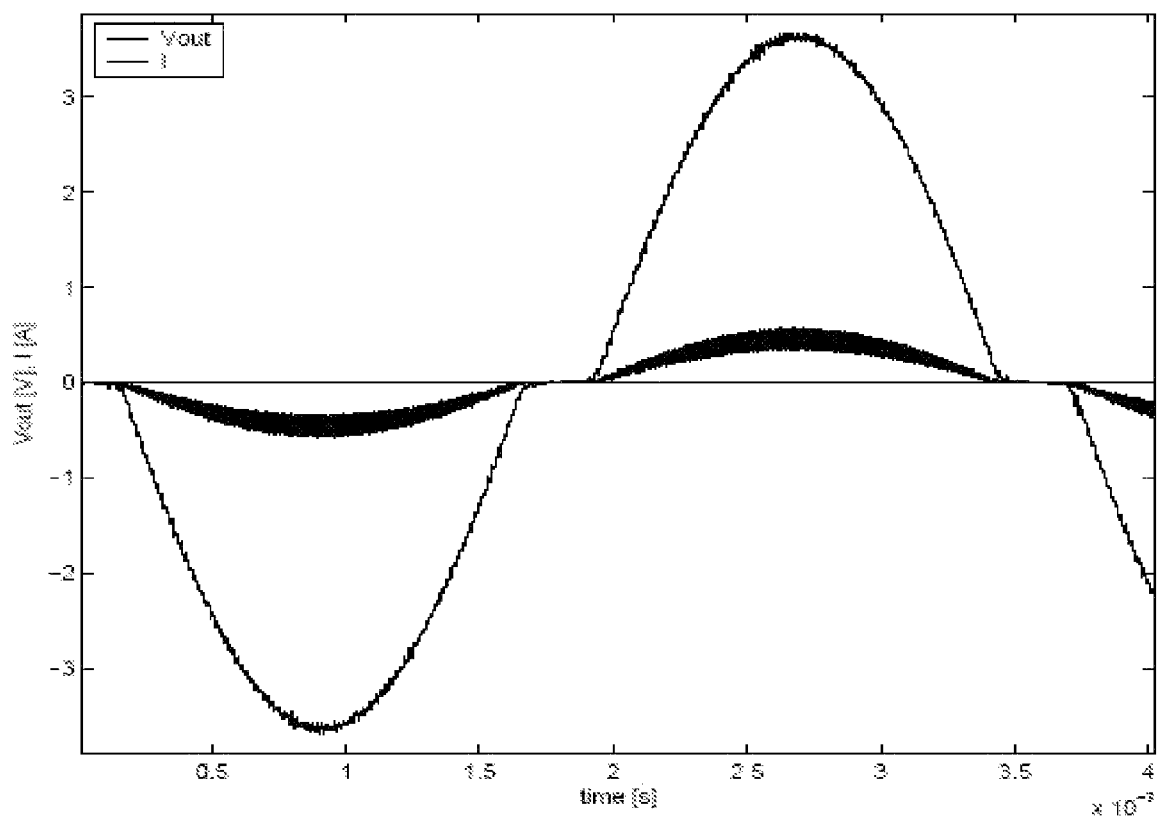
Figure 5

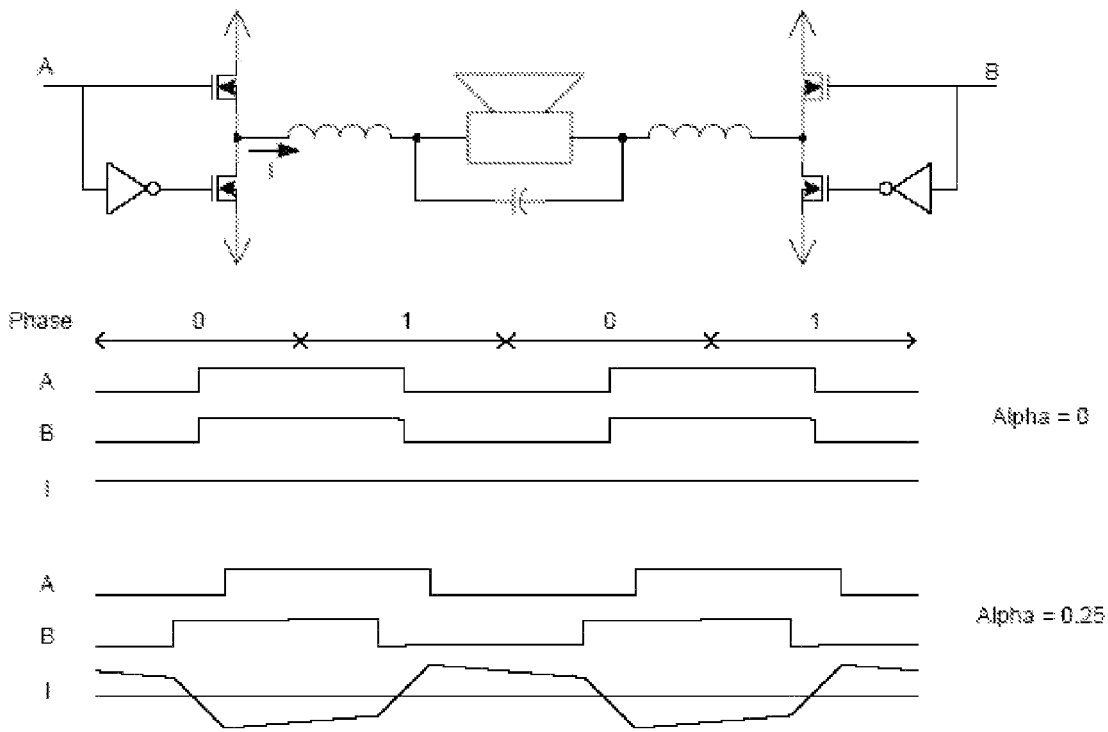
Figure 10: Simplified output schematic and waveforms for 3-level modulation
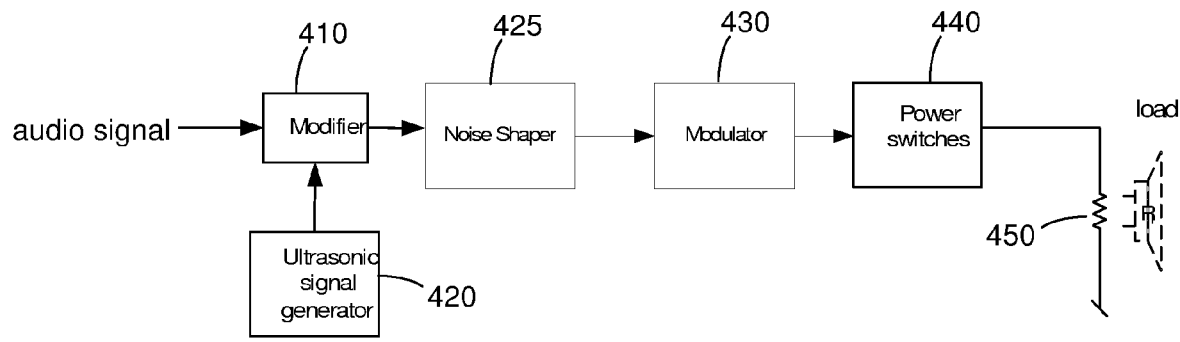
Figure 11 noise shaper inserted

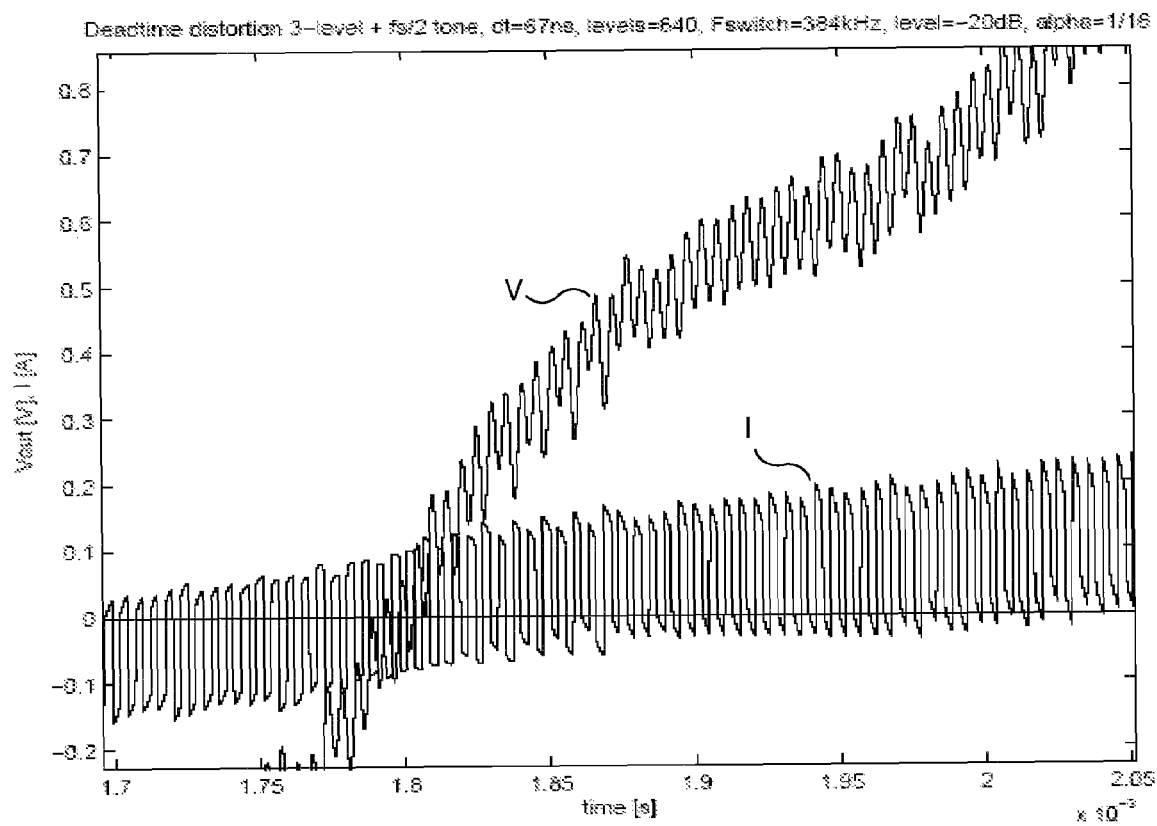
Figure 14
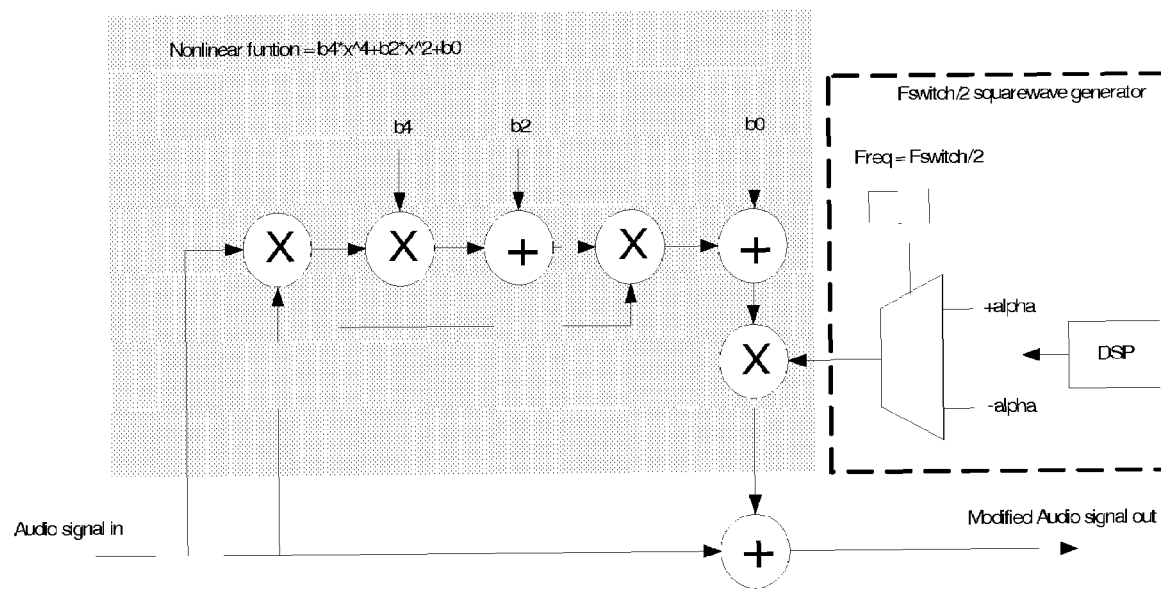
Figure 15 : An example of modifier implementation

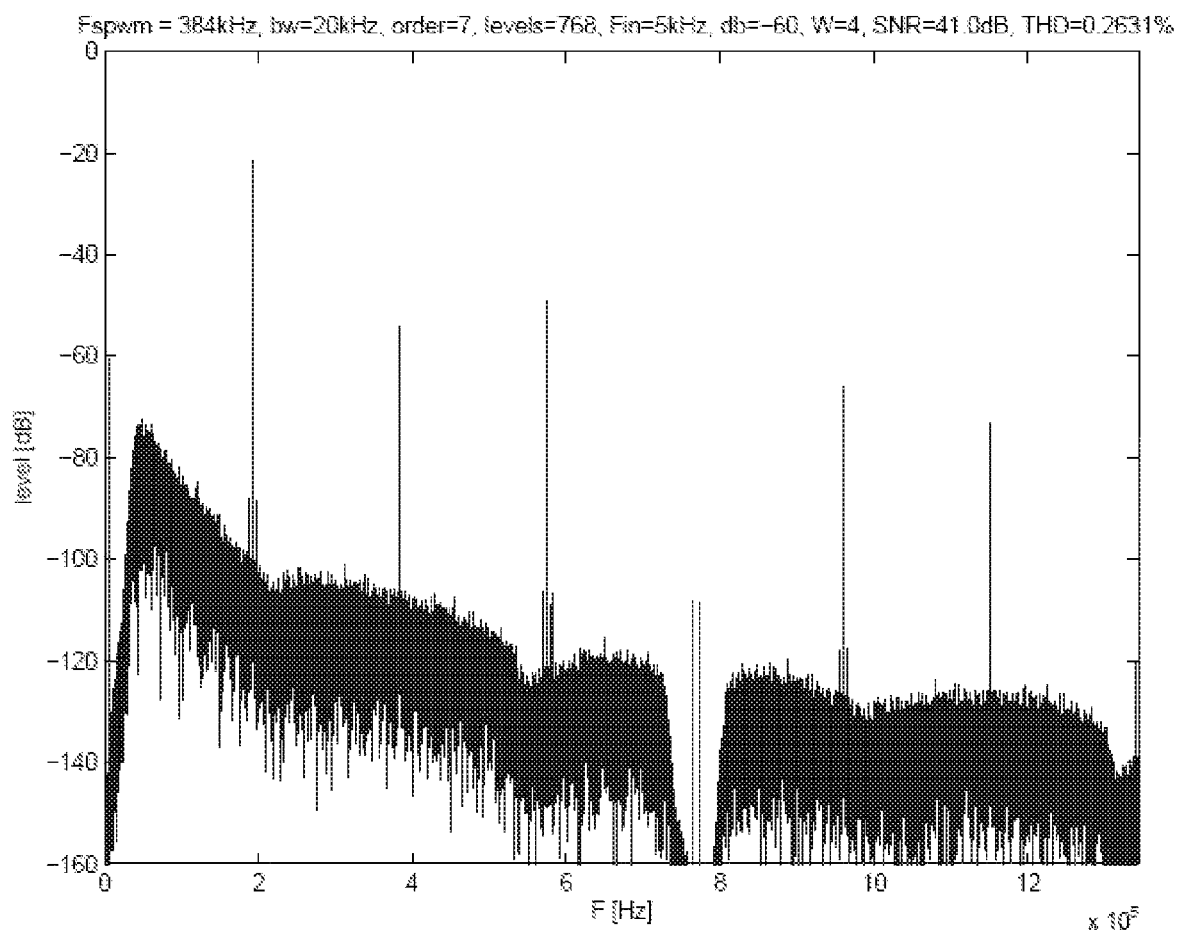
Figure 18
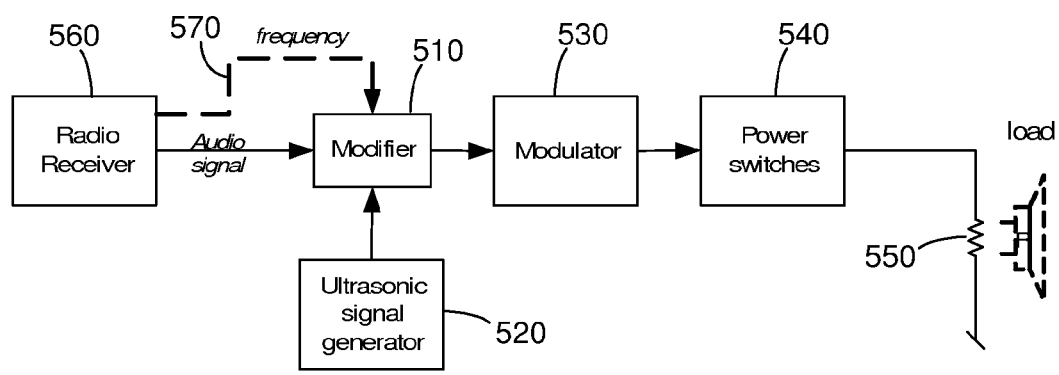
Figure 19: Combination of switching amplifier and radio receiver.

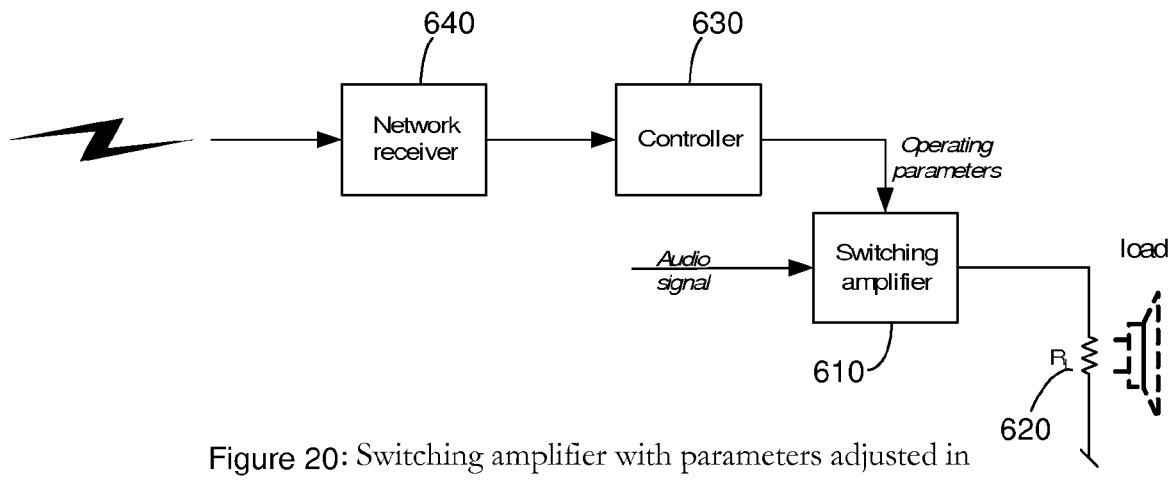
Figure 20: Switching amplifier with parameters adjusted in response to messages from a general-purpose network.
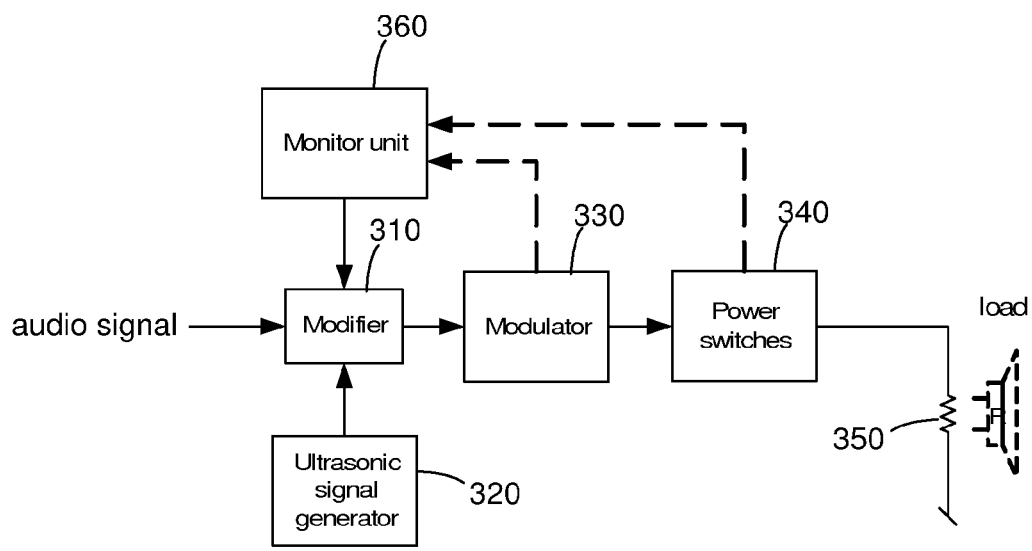
Figure 21: Amplifier with monitor unit

SYSTEMS AND METHODS FOR IMPROVING PERFORMANCE IN A DIGITAL AMPLIFIER BY ADDING AN ULTRASONIC SIGNAL TO AN INPUT AUDIO SIGNAL

CROSS-REFERENCE TO RELATED APPLICATIONS

This application claims the benefit of U.S. Provisional Patent Application 60/761,614, filed Jan. 24, 2006, which is incorporated by reference as if set forth herein in its entirety.

BACKGROUND

1. Field of the Invention

The invention relates generally to electronic devices, and more particularly to systems and methods for improving the performance of switching amplifiers by adding an ultrasonic signal to an input audio signal before amplifying the audio signal.

2. Related Art

Pulse-width modulation (PWM) amplifiers are sometimes used to amplify audio signals. In a two-level PWM modulation scheme, a pair of signals (A, B) are used to switch a pair of FETs on and off to thereby pull the voltage across the load (speaker) alternately up or down. (See FIG. 1.) The signals A and B each consist of a series of pulses of varying widths. If the audio signal is increasing, the high-side signal (A) will have wider pulses and the low-side signal (B) will have narrower pulses. Similarly, if the audio signal is decreasing, the high-side signal will have narrower pulses and the low-side signal will have wider pulses.

Some PWM amplifiers use a three-level (class BD) modulation scheme instead of a two-level scheme. In a three-level PWM modulation scheme, the pair of signals A and B are used to switch two pair of FETs on and off. Rather than only being able to pull the speaker voltage up or down, the FETs may also be controlled to couple both sides of the load to the same voltage (i.e., to not pull the voltage up or down.) An exemplary system is shown in FIG. 2.

A three-level modulation scheme can have two sources of distortion, including coincidence distortion and dead-time distortion. Coincidence distortion is caused because, at low signal levels, the two sides of the bridge switch almost simultaneously. Dead-time distortion shows up, or is most noticeable, at low signal levels because the dead-times occur while the output current is close to 0. Dead-time distortion normally causes the signal to be flattened at the zero-crossings.

SUMMARY OF THE INVENTION

This disclosure is directed to systems and methods for improving the performance of switching amplifiers that solve one or more of the problems discussed above. In one particular embodiment, an ultrasonic signal (e.g., a tone at half of the switching frequency, $F_{switch}$) is introduced into an audio signal received by a switching amplifier. The added ultrasonic signal shifts the signals (A, B) that are input to power switches in the amplifier so that they do not switch nearly simultaneously, and it causes the output current to be well defined to eliminate dead time distortion at low signal levels. Adding the ultrasonic signal causes the distortion to shift to an amplitude greater than zero. Signals that exceed this amplitude will experience the distortion, but the distortion will be less noticeable than in lower-amplitude signals. Signals that do not exceed this amplitude will not experience the distortion at all. While the same effect can also be achieved by skewing signals A and B with respect to each other (i.e., adjusting the relative timing of the signals,) adding a signal is simpler, easier to implement, and equally effective. Another benefit of adding an ultrasonic signal is to draw switching energy away from the switch frequency and its harmonics. This can be used to avoid potential problems of interference with AM radio reception.

One embodiment comprises a switching amplifier having a modulator, power switches, an ultrasonic signal generator, and a modifier. The modifier receives an audio signal from an amplifier input and an ultrasonic signal from the ultrasonic signal generator. The modifier modifies the audio signal in dependence on the ultrasonic signal and then provides the modified audio signal to the modulator. The modulator generates a switching waveform from the modified audio signal and provides the switching waveform to the power switches, which generate an output based on the switching waveform.

In one embodiment, the modifier comprises an adder that adds the ultrasonic signal to the input audio signal. The ultrasonic signal may, for example, be a tone at half the switching frequency of the amplifier. The ultrasonic signal may be scaled according to the output of a nonlinear function generator which operates in dependence on the input audio signal. The nonlinear function generator may be configured to reduce the amplitude of the ultrasonic signal when the audio signal has a value close to a maximum value that the amplifier can handle in a substantially linear manner. The modifier may alternatively be configured to modify the input audio signal in dependence on a programmable gain coefficient.

In one embodiment, the amplifier includes a monitor configured to provide information to the modifier relating to the operation of the amplifier. The modifier may then adjust its operation (e.g., by adjusting a gain coefficient that multiplies the ultrasonic signal, or a nonlinear function of the audio signal that multiplies the ultrasonic signal) based on information provided by the monitor. The information provided by the monitor may, for instance, comprise a setting of a volume control, an input signal type, an input signal strength, or occurrence of clipping in the amplifier. The modifier may be enabled or disabled depending upon whether signals indicate that radiation from the amplifier causes interference with radio reception. These signals may also indicate a frequency and bandwidth received by the radio receiver. The amplifier may itself include the radio receiver. In one embodiment, the amplifier also includes a noise-shaped quantizer having a noise transfer function having a zero that substantially reduces the noise transfer function at the frequency of the ultrasonic signal.

Another embodiment comprises a method implemented in a switching amplifier that amplifies an audio signal. This method includes generating an ultrasonic signal and adding the ultrasonic signal to the audio signal prior to amplifying it. The method may reduce coincidence distortion at low signal levels within the amplifier, reduce dead time distortion within the amplifier, and/or reduce radiation of a signal in an AM radio band. The ultrasonic signal may, in one embodiment, comprise a tone having a frequency which is half the switching frequency of the switching amplifier. The method may include storing a gain coefficient in a programmable memory and multiplying the ultrasonic signal by the gain coefficient. The method may also include multiplying the ultrasonic signal by a nonlinear function of the audio signal. The method may further include reducing a probability of overload in the amplifier by causing the nonlinear function to decrease when the audio signal is large. In one embodiment, the method includes monitoring the operation of the amplifier to detect a clipping- or overload-related condition and adjusting the ultrasonic signal in response to the condition being detected. The detected conditions may include actual or incipient clipping, or actual or incipient overload. In one embodiment, the method is implemented in an amplifier including a noise-shaped quantizer. In this embodiment, the method may include reducing an audio-frequency intermodulation product between the ultrasonic signal and noise produced by the quantizer by configuring the noise transfer function of the quantizer to have a reduced amplitude at frequencies close to the frequency of the ultrasonic signal.

Yet another embodiment comprises a system including a switching amplifier, a controller and a network receiver. The amplifier uses a switching waveform having a fundamental frequency, and the amplifier has at least one operating parameter that is adjustable. The controller is configured to receive messages from the network receiver and to adjust the operating parameter of the amplifier to reduce the amplitude of signals at the fundamental frequency or harmonics thereof in response to the network receiver receiving a message indicating that the amplifier is potentially creating interference with a radio receiver. The network may comprise various types of networks, such as wired networks, wireless networks, optical networks, Ethernet networks, Power-line networks, MOST networks, CAN networks, IEEE 802.11 networks, Bluetooth networks, or various other types of networks.

Numerous other embodiments are also possible.

BRIEF DESCRIPTION OF THE DRAWINGS

Other objects and advantages of the invention may become apparent upon reading the following detailed description and upon reference to the accompanying drawings.

FIG. 1 is a schematic diagram illustrating a pair of FET's that are driven by signals of a 2-level modulation system to generate an output audio signal to be applied to a speaker.

FIG. 2 is a schematic diagram illustrating two pair of FET's that are driven by signals of a 3-level modulation system to generate an output audio signal to be applied to a speaker.

FIG. 3 is a functional block diagram illustrating the structure of a system in accordance with one embodiment.

FIG. 4 is a functional block diagram illustrating the structure of a modifier in accordance with one embodiment.

FIGS. 5-7 are time-domain plots demonstrating the effects of dead-time on a 3-level bridged output.

FIG. 10 is a diagram showing the simplified structure of a 3-level output stage and waveforms showing how adding a tone at half the switching frequency affects the 3-level modulation.

FIG. 11 is a functional block diagram illustrating the structure of a system that includes a noise shaper in accordance with one embodiment.

FIG. 14 is a time-domain plot demonstrating that the amplitude of the added tone controls the amplitude of the current, and thus the "width" of the linear region.

FIG. 15 is a functional block diagram illustrating an implementation of a modifier in accordance with one embodiment.

FIGS. 17 and 18 are frequency-domain plots demonstrating the effect of adding a tone at half the switching frequency.

FIG. 19 is a functional block diagram illustrating a system in which an amplifier is coupled to an AM radio receiver in accordance with one embodiment.

FIG. 20 is a functional block diagrams illustrating a system in which an amplifier is connected to other audio system components by a network in accordance with one embodiment.

FIG. 21 is a functional block diagram illustrating the structure of a system employing a monitor in accordance with one embodiment.

Figure 6:
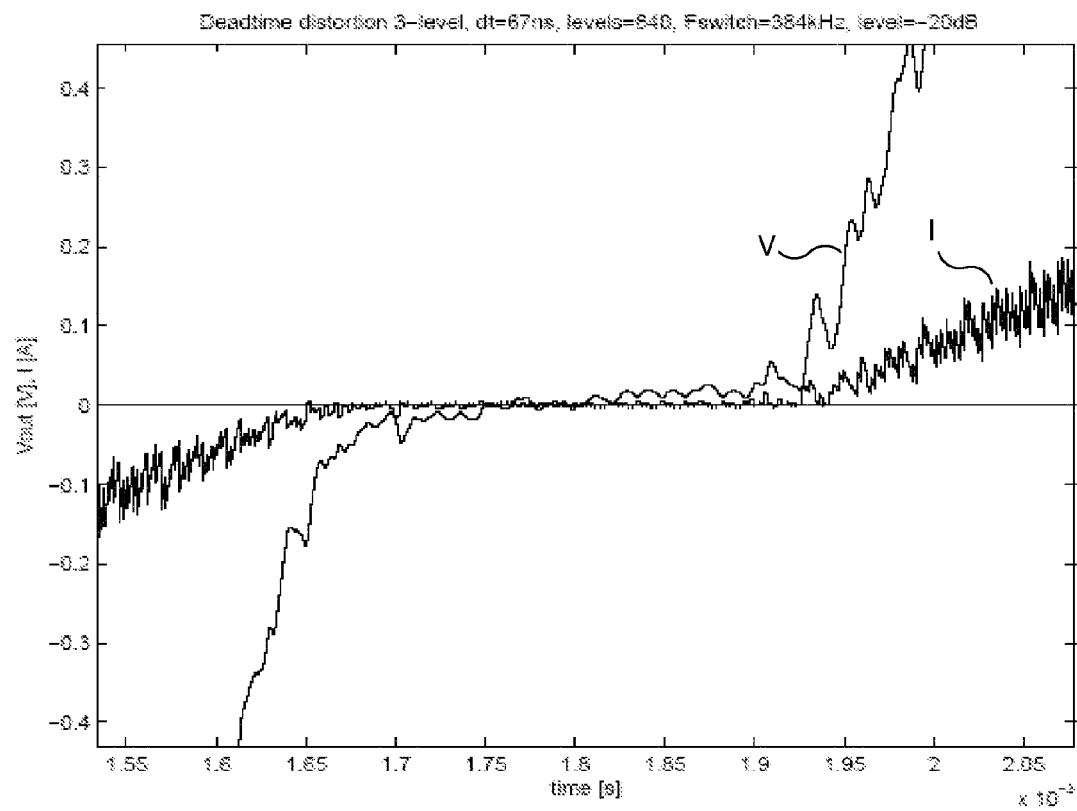

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods in which a tone (e.g., at half of the switching frequency, $F_{switch}$) is introduced into the audio signal of a switching amplifier. The added tone shifts the signals (A, B) input to the power switches so that they do not switch nearly simultaneously, and it causes the output current to be well defined to eliminate dead time distortion at low signal levels. Adding the tone at $F_{switch}/2$ causes the distortion to shift to an amplitude greater than zero. Signals that exceed this amplitude will experience the distortion, but the distortion will be less noticeable than in lower-amplitude signals. Signals that do not exceed this amplitude will not experience the distortion at all. While the same effect can also be achieved by skewing signals A and B with respect to each other, adding a tone at half the switching frequency is simpler, easier to implement, and equally effective. Another benefit of adding a tone at half the switch frequency is to draw switching energy away from the switch frequency and its harmonics. This can be used to avoid potential problems of interference with AM radio reception.

Referring to FIG. 3, a functional block diagram illustrating the structure of a system in accordance with one embodiment is shown. In this embodiment, a modifier 110 accepts an audio signal and a signal from ultrasonic signal generator 120 as inputs. Modifier 110 modifies the audio signal based on the ultrasonic signal from ultrasonic signal generator 120 and provides the modified signal to modulator 130. Modulator 130 generates pulse width modulated signals from the modified audio signal and provides the pulse width modulated signals to power switches 140. Power switches 140 generate analog output signals that are used to drive a load 150, such as a speaker. It should be noted that while FIG. 3 shows the output of power switches 140 as being applied to only one side of load 150, the coupling of the power switches to the load is depicted in this manner for simplicity. In actuality, the two analog signals output by the power switches in a three-level system would be applied to opposite sides of the load as shown in FIG. 2. This simplification is made in the system diagrams below as well.

Referring to FIG. 4, a functional block diagram illustrating the structure of a modifier in accordance with one embodiment is shown. In this embodiment, modifier 210 has a first input for receiving an audio signal, and a second input for receiving an ultrasonic signal generated by ultrasonic signal generator 220. The audio signal is provided to an adder 240 and a nonlinear function generator 230. Nonlinear function generator 230 generates a signal that is a nonlinear function of the received audio signal. This nonlinear function signal is provided to multiplier 250. Multiplier 250 receives the ultrasonic signal from signal generator 220 and scales the ultrasonic signal by the signal output from nonlinear function generator 230. The scaled ultrasonic signal is then provided to adder 240, where it is added to the input audio signal to produce a modified audio signal which is output from modifier 210.

Dead-Time for 3-Level Bridged Output

Figure 7:
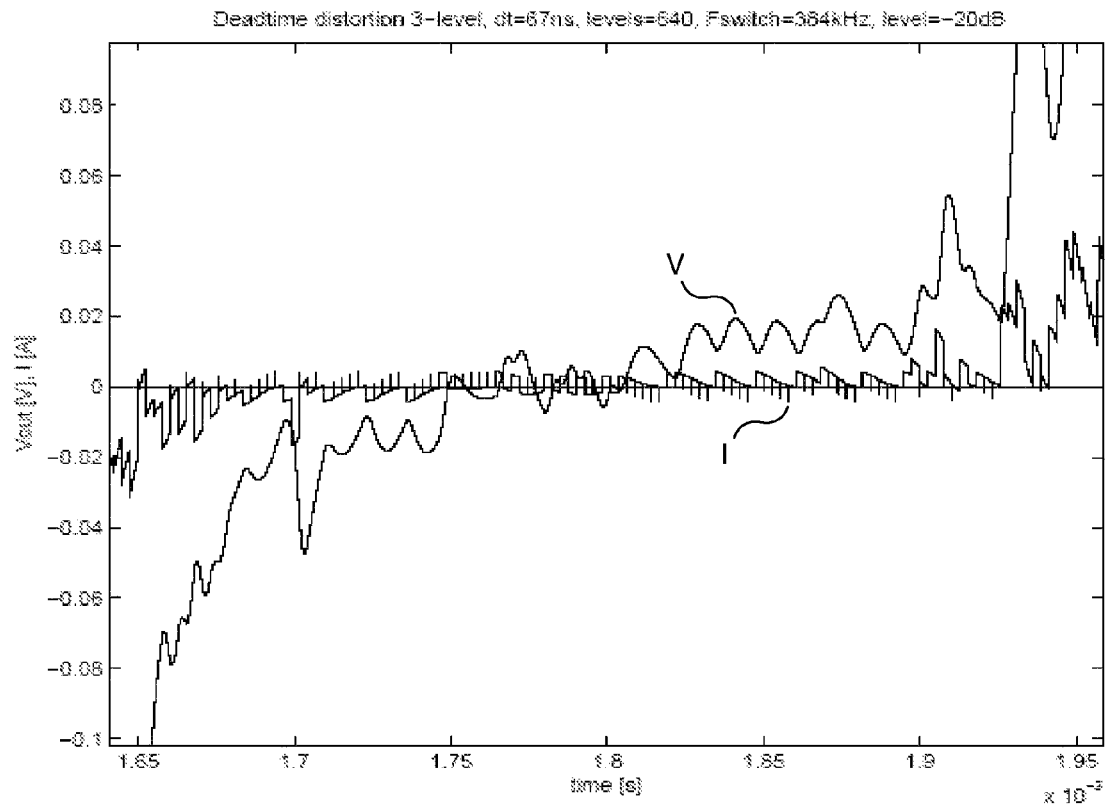

FIGS. 5-7 show time-domain plots from a simulation and demonstrate the effects of dead-time on a 3-level bridged output. For demonstration purposes, the dead-time has been exaggerated and set to approximately 70 ns. The plot in FIG. 5 shows the output voltage and inductor current for one cycle of a 320 Hz tone at −20 dB of full scale for a 48V power supply into an 8 Ohm load. For 3-level modulation, there is little ripple in the inductor current for small signal levels. This means that the zero-crossings occur for small signal levels. All signals will exhibit this type of distortion in a 3-level system, but the distortion seems worse at low signal levels because the distortion is significant compared to the signal. FIGS. 6 and 7 zoom in further on the zero-crossing region to highlight details.

Figure 8:
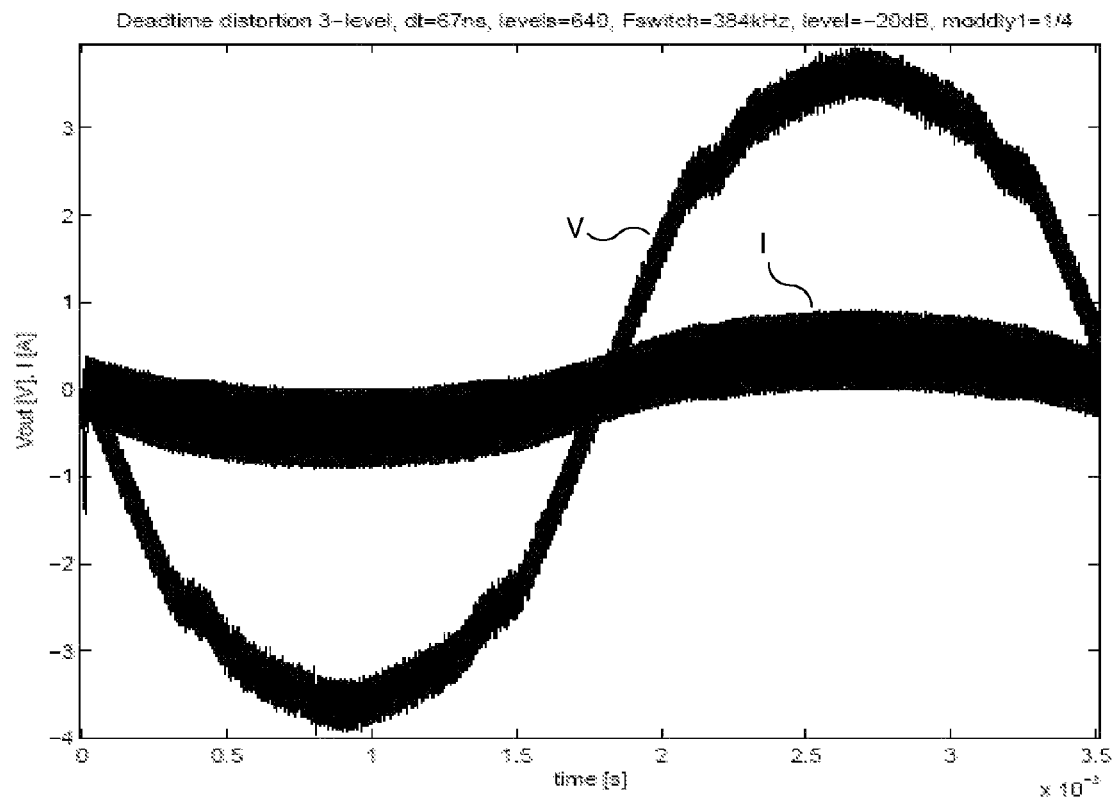
FIGS. 8 and 9 are time-domain plots demonstrating the effects of delaying the PWM output of one side of the bridge in a 3-level system to create a current ripple and push the current zero-crossings away from low output levels.
Figure 9:
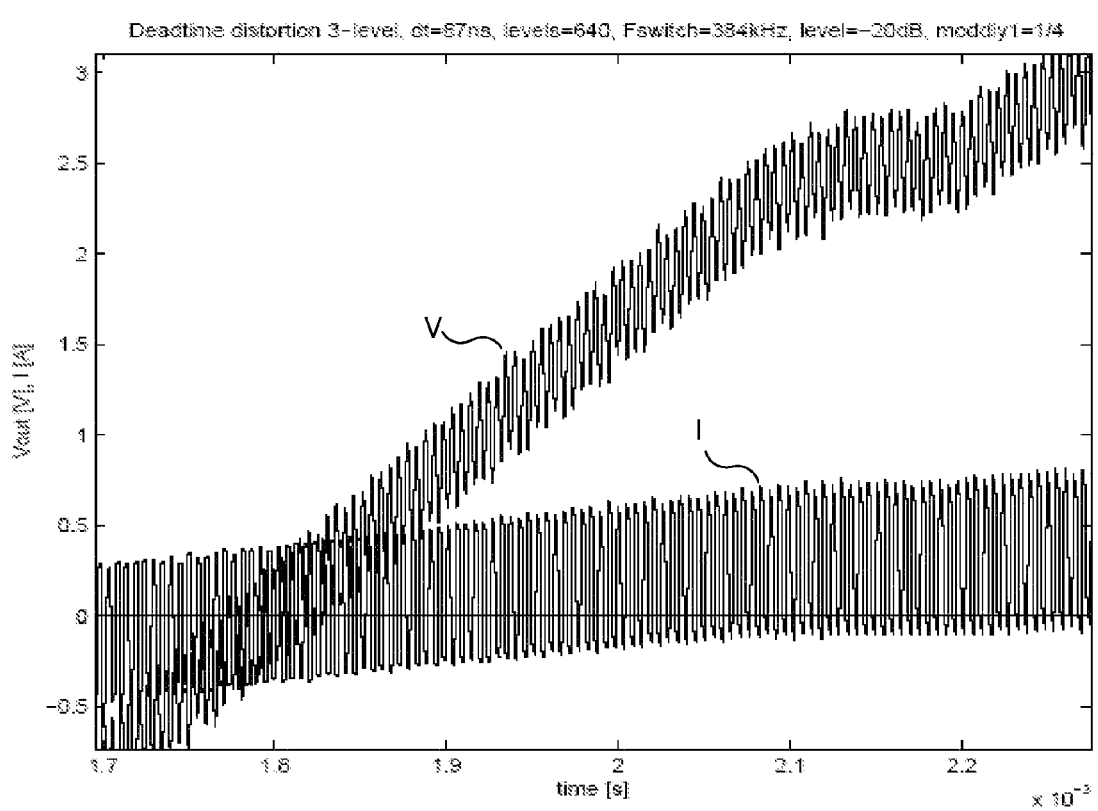

Delaying the PWM output of one side of the bridge creates a current ripple, and pushes the current zero-crossings away from low output levels, as for 2-level modulation. The time domain plots of FIGS. 8 and 9 are obtained by delaying the B signal relative to the A signal by ¼ of a switch period.

Effect of Adding a Tone at $F_{switch}/2$ on 3-Level Modulation Distortion 2 sources of distortion for 3-level modulation (class BD) can be affected by adding the tone:

Coincidence Distortion:

At low signal levels the two sides of the bridge will be switching almost simultaneously. In order to minimize coupling from one edge to the other it is advantageous to pull the two switching instances apart in time.

Dead-Time Distortion:

Dead-time in the output stages shows up at low signal levels, because the dead-times occur while the output current is close to 0 and thus the output level during the dead-time becomes signal dependent.

FIG. 10 shows how adding a tone at $F_{switch}/2$ affects the 3-level modulation PWM waveforms. A tone at $F_{switch}/2$ is at half the switch rate, corresponding to 192 kHz for a switch rate of 384 kHz. A $F_{switch}/2$ tone with an amplitude alpha can be efficiently generated as a sequence of samples +alpha, −alpha, +alpha, −alpha etc. FIG. 10 shows what happens when this is added to a 0 input signal. For Phase=0, −alpha is added. For phase=1, +alpha is added.

The 2 sets of curves, A and B, show the effect on coincidence distortion. The top set of curves is for O-input and alpha=0, which means that the two modulation outputs A and B switch simultaneously. The bottom set of curves is for alpha=0.25. For Phase=0, the modulator input is −alpha, which means that the B-side will go low before the A-side goes high. For Phase=1, the modulator input is +alpha, which means that the A-side will go low after the B-side goes high. The A- and B-sides no longer switch simultaneously.

Dead-time distortion has been described using a very simplified model of the output stage. The problem occurs when an LC-filter with a single capacitor across the load as shown in FIG. 10 is used. During dead-time—when neither the top or bottom FETs in one of the 2 half-bridges are conducting—the output level will be determined by the direction of current I. When the inductor current from the half-bridge is positive (I>0,) its output will be pulled low during dead-time. When the inductor current from the half-bridge is negative (I<0,) its output will be pulled high during dead-time.

The 2 sets of curves show the effect on the current for a zero input signal. In the top set of curves A and B switch simultaneously and the current I becomes 0. On the bottom set of curves, B switches before A, and the current now fluctuates around 0. The current goes negative for Phase=0 and positive for Phase=1, but it is well defined positive or negative when the A- and B-sides switch.

When a small input signal is added, the current I will be modulated by the signal. In the first case, for alpha=0, this will cause the output levels during dead-time to depend on the signal—and thus create distortion. For the case alpha>0, we will still get well defined positive and negative currents at the switching instances as long as the current modulation caused by the signal is less than the current ripple from the $F_{switch}/2$ tone—and thus no distortion is created.

For higher amplitude signals where the signal current is greater than the $F_{switch}/2$ ripple current, the distortion is not eliminated, but it now occurs at signal levels that will help "mask" the effect.

Adding a $F_{switch}/2$ tone will push the "cross-over" dead-time distortion away from 0, basically eliminating it for input signals at low levels where the distortion would be most noticeable.

Adding the tone has a smaller effect on dead-time distortion when using an output LC filter with separate capacitors on each side of the load, similar to 2 half-bridge output filters driving a single load in bridged mode.

Adding the tone has benefits similar to delaying one side of a full-bridge 3-level modulation scheme, but obtains these benefits in a completely different way. See, for instance, patent PCT/DK99/00418 (U.S. Pat. No. 6,373,336B1) by Risbo and Anderskouv.

One problem with adding the tone is that it will show up in the wide-band output spectrum. The level of the tone is scaled by the programmable factor alpha to allow trade-off between the "visibility" of the tone in plots and how far distortion is pushed away from 0 level.

Adding the tone will usually increase the peak amplitude of the signal that is fed to subsequent stages of the amplifier, thus reducing the maximum input signal that can be handled before clipping or other overload behavior occurs. In an amplifier that includes a noise shaper, it will typically be the noise shaper that will clip first. Such an amplifier is illustrated in FIG. 11, a functional block diagram illustrating the structure of a system that includes a noise shaper. The system includes a modifier 410 which is configured to receive an input audio signal, and to modify this audio signal with an ultrasonic signal received from ultrasonic signal generator 420. Rather than providing this modified audio signal directly to modulator 430, the signal is provided to noise shaper 425. Noise shaper 425 quantizes the signal before passing the signal on to modulator 430. Modulator 430 then generates pulse with modulated signals from the audio signal and provides these signals to power switches 440. The output of power switches 440 is then used to drive a load 450.

In order to fix the clipping in the noise shaper, the tone can be scaled by the polynomial $P(x)=1-x2$, where x is the signal level before the tone is added. Since x is in the range −1 to 1, 1−x2 will be close to 0 at high levels, with x close to −1 and 1, while it will be close to 1 for low signal levels, with x close to 0.

Yet another problem is that the tone can intermodulate with the noise-shaper noise around $F_{switch}/2$ in the non-linearities of the PWM output. If there is "room" in the noise budget, it can be beneficial to design a noise transfer function for the noise shaper with a small dip in the vicinity of the $F_{switch}/2$ tone to reduce the amount of noise that will intermodulate back into the audio band.

Figure 12:
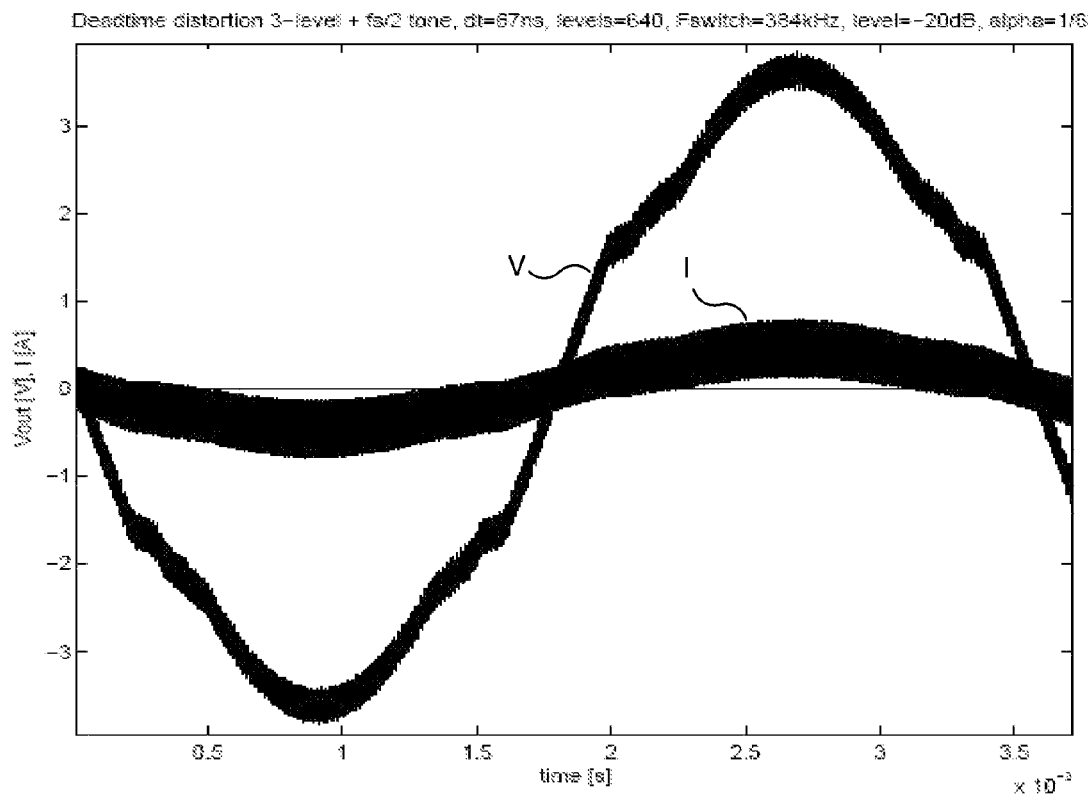
FIGS. 12 and 13 are time-domain plots demonstrating that adding a tone at half the switching frequency generates a current ripple at the same frequency.
Figure 13:
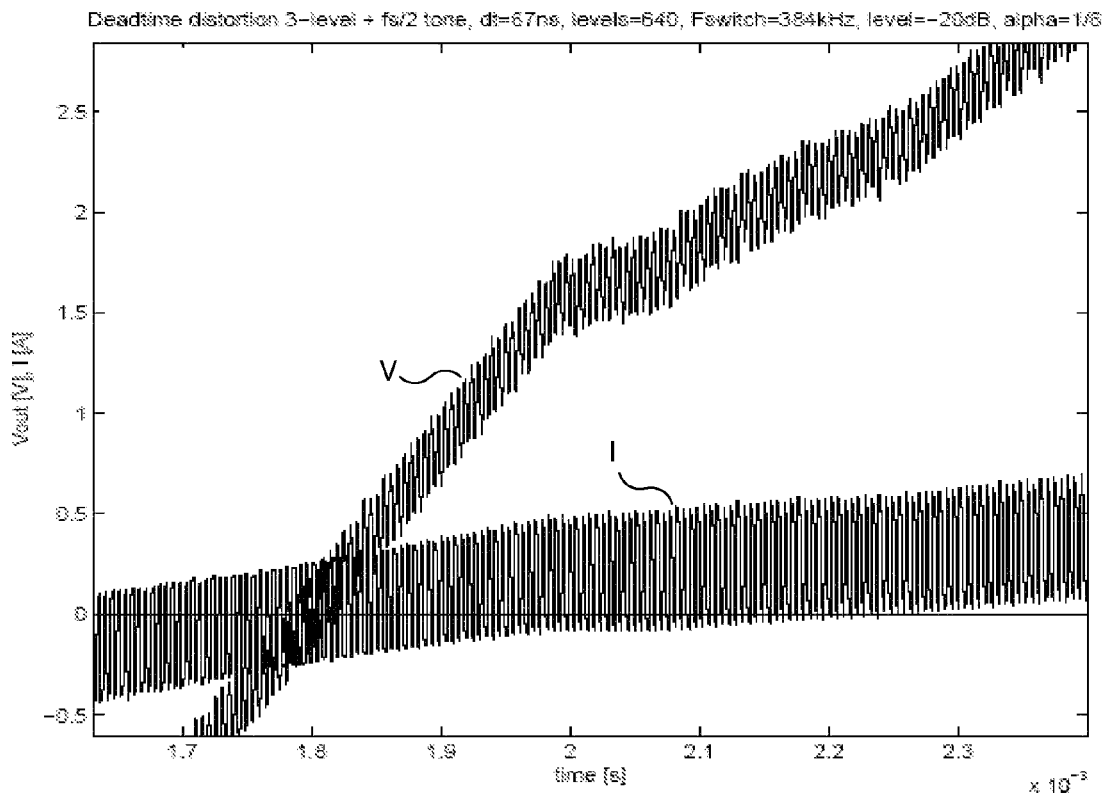

The plots of FIGS. 12 and 13 show that adding a tone at $F_{switch}/2$ generates a current ripple at the same frequency. For low signal levels, this means that the current crosses 0 in every switch period, and that the output is linear. The amplitude alpha of the $F_{switch}/2$ tone controls the amplitude of the current, and thus the "width" of the linear region. The plot shown in FIG. 14, which was obtained for alpha=1/16, demonstrates this.

Effect on AM-radio Reception

The $F_{switch}/2$ tone can also be used to drive energy away from the switch tone $F_{switch}$. When an amplifier is driven with zero input signal, very little signal energy is distributed into the audio band, and a little is spread over higher frequencies by the noise shaper, while the level of energy at the switch frequency will be at its peak. As the input is modulated more energy will be deposited at other frequencies, so the amount of energy at the switch tone will decrease.

Driving signal away from the switch tone can be used to implement "AM-radio avoidance." The carrier frequency band for AM-radio (500 to 1500 kHz) lies within the range of the fundamentals and harmonics of the switch frequencies used for class-D amplifiers (fundamental 250 to 1000 MHz). Thus, when a class-D amplifier is used close to an AM-radio, the fundamental and harmonics of the switch tone can interfere with bands of the AM-radio. One way to avoid this is to change the switch frequency of the class-D amplifier when it interferes with the radio, as described for instance in U.S. patent application 2004/0100328 by Melanson. However, changing the switch frequency of a class-D amplifier on the fly can be problematic, so an alternate method is to use the $F_{switch}/2$ tone. When the $F_{switch}/2$ tone interferes with AM-radio reception, the $F_{switch}/2$ tones can be increased to drive energy away from $F_{switch}$.

To drive away maximum energy, we need to maximize the level of the tone added at $F_{switch}/2$ without clipping. In general, when the tone is scaled by a polynomial P(x) and a factor alpha, the signal plus added tone will have a maximum signal less than or equal to |x|+alpha*|P(x)|. To ensure that the signal does not clip, we need to select P(x) so that |P(x)|<= (1−|x|)/alpha, or for alpha=1 we need |P(x)|<=1−|x|.

The "best" we can do with a 2nd order polynomial of the form P(x)=1−x2, as used to avoid distortion at low levels for 3-level modulation, is to set alpha=0.5 (found by solving alpha*(1−x2)+x<=1 for 0<=x<=1). However, this polynomial scaling only generates a tone at $F_{switch}/2$ at ½ the maximum level for input signal x=0.

A better solution can be found by using a 4th order polynomial P(x)=b4*x4+b2*x2+b0 and selecting b4=1.3863, b2=−2.2725, b0=0.8863 and alpha=1. However, since a proposed embodiment does not handle coefficients larger than 2, we can divide the coefficients by 2/b2 for b4=1.2200, b2=−2 and b0=0.7800 and use alpha=b2/2=1.1363.

Referring to FIG. 15, a functional block diagram illustrating an implementation of a modifier in accordance with one embodiment is shown. In this embodiment, the modifier uses a square wave at half the switching frequency. This square wave is scaled by a nonlinear function that is defined by the 4th order polynomial P(x)=b4*x4+b2*x2+b0.

Figure 16:
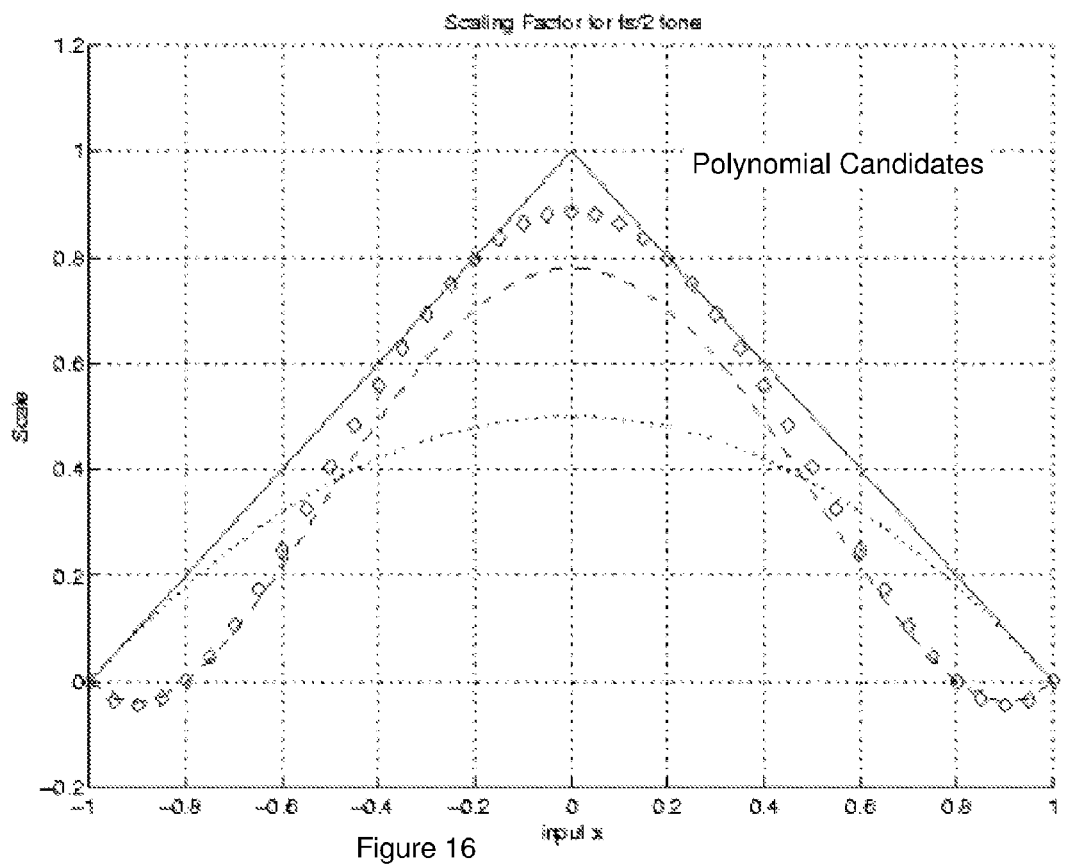
FIG. 16 is a diagram showing candidates for polynomial functions used to scale the added ultrasonic signal.

FIG. 16 shows some candidates for polynomial scaling functions. The solid line is the maximum level 1−|x| of the scaling function that is possible without clipping. The polynomials must stay higher than a similar lower limit |x|−1 to ensure |P(x)|<=1−|x|.

The dotted line is 2nd order P(x)=1−x2 with maximum setting alpha=0.5. The line illustrated by the diamonds is the 4th order polynomial P(x)=1.3863*x4−2.2725*x2+0.8863 with alpha=1, while the stippled line shows the version P(x) *2/2.2725=1.22*x4−2.00*x2+0.78 with maximum coefficient value of 2. With a 4th order polynomial, we have larger range for alpha and better suppression of $F_{switch}$ power when input audio (x) is 0 or at low level.

Polynomials are chosen as a "predictable" way of scaling the $F_{switch}/2$ tone. In contrast to other non-linear scaling functions, like for instance P(x)=1−|x| that would get the $F_{switch}/2$ tone at the maximum level without clipping, we can predict and make sure that the harmonics they create of the input signal are not affecting the audio band performance. We could go to higher order polynomials to get closer to maximum level, but the added computational cost and harmonics does not make it worthwhile.

Figure 17:
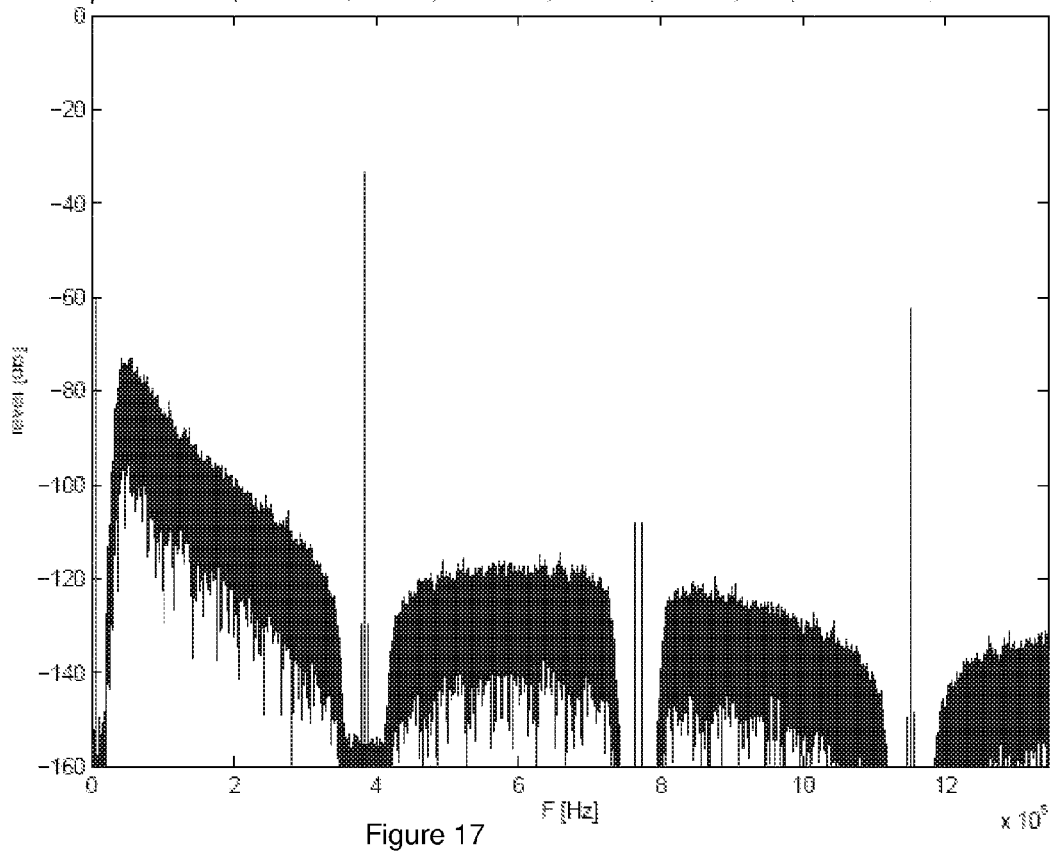

The effect of adding the $F_{switch}/2$ tone is demonstrated by the plots of FIGS. 17 and 18, which are generated from simulations. The setup is switch rate 384 kHz, 768 levels, a "perfect" half-bridge output stage with 22 uH/0.47 uF LC filter into an 8 ohm load. The input is a 5 kHz pure sine wave at −60 dB from full scale. The plot in FIG. 17 for alpha=0 shows the fundamental switch tone at 384 kHz and a 3rd harmonic at 1152 kHz. Around the 2nd harmonic at 768 kHz we only see "copies" of the 5 kHz output tone.

The plot in FIG. 18 is the same setup, but with coefficient alpha=160/128=1.25 multiplying the polynomial 1.22*x4−2.00*x2+0.78. We now see the tones at $F_{switch}/2$ and its harmonics—and we see that the $F_{switch}$ and 3 $F_{switch}$ tones are reduced substantially.

The following Table summarizes the performance for alpha=0, 140/128 and 160/128. The setting alpha=160/128 reduces the fundamental $F_{switch}$ by more than 20 dB and the 3rd harmonic by more than 10 dB. The cost is a decrease of reported SNR from 70 dB to around 40 dB, referred to a 60 dB input level, i.e. a noise increase from −130 dB to −100 dB referred to full scale. The increased noise may be attributed to intermodulation between the $F_{switch}/2$ tone and noise components close to $F_{switch}/2$ generated by the noise shaper, as previously discussed.

TABLE 13-4

Simulated amplifier performance and noise peak levels

| alpha | SNR | Fs/2 (192 kHz) | Fund. (384 kHz) | 3rd harm. (1152 kHz) |
|---|---|---|---|---|
| 0 | 70.45 dB | — | −33.4 dB | −62.1 dB |
| 140/128 | 42.43 dB | −22.5 dB | −45.1 dB | −65.0 dB |
| 160/128 | 40.96 dB | −21.5 dB | −54.0 dB | −73.3 dB |

Unfortunately however, the setting alpha=160/128 does not avoid clipping at all signal levels. This can be understood with reference to FIG. 16: a setting alpha=145.5/128 would provide the effect illustrated by the diamonds. The setting alpha=160/128 scales up the curve indicated by the diamonds and thus violates the requirement that the polynomial, when scaled by alpha, be less than 1−|x| in order to avoid clipping, the violation occurring over the range x=0.027 to x=0.422 approximately. A value alpha=140/128 allows clipping to be avoided for all x in the range −1 to 1 and with a reasonable safety margin, while still providing an 11.5 dB reduction of the output tone at frequency $F_{switch}$. Therefore, it may be preferred to use a value alpha=160/128 at very low signal levels and to provide a means to reduce the value of alpha to, for example, 140/128 when it is detected that the input signal level may exceed a threshold such as 0.027.

The increased noise level that obtains when the $F_{switch}/2$ tone is added at a substantial level, may well be acceptable in the context of AM radio reproduction. Since the reason to add the $F_{switch}/2$ tone at a substantial level is to reduce some components of AM radio interference, it may be advantageous to switch in the $F_{switch}/2$ tone in dynamically when needed. To do this, the amplifier needs to know when the switch rate $F_{switch}$ or its harmonics interfere with AM reception. An exemplary system that is configured to provide this information to the amplifier is illustrated in FIG. 19.

Referring to FIG. 19, a functional block diagram illustrating a system in which an amplifier is coupled to an AM radio receiver is shown. The system includes a modifier 510, ultrasonic signal generator 520, modulator 530, power switches 540 and a load 550, each of which is configured essentially as described above. In this system, however, radio receiver 560 provides not only the input audio signal to modifier 510, but also provides control information to the modifier via control signal line 570. This control information may, for example, include information such as the carrier frequency corresponding to the received audio signal and the width of the frequency band to which the radio receiver is sensitive, or logic signals indicating whether the ultrasonic signal is interfering with reception of the radio signal.

For the setup above for example, given a switch rate $F_{switch}$, an AM radio center frequency Fc and a desired 'tone-less' bandwidth bw around Fc, we need to turn the $F_{switch}/2$ tone on when:

--- if (($F_{switch}$ > Fc−bw &&
$F_{switch}$ < Fc+bw) || (3*$F_{switch}$ > Fc−bw && 3*$F_{switch}$ < Fc+bw))
   $F_{switch}/2$ tone on
else
   $F_{switch}/2$ tone off

---

Of course, if the $F_{switch}/2$ tone is needed for the purposes of reducing dead-time distortion or reducing coincidence distortion, then the command "turn $F_{switch}/2$ tone off" may be interpreted as an instruction to reduce the coefficient alpha to an appropriate lower value rather than to remove the tone completely.

A processor in the amplifier can calculate this if a bandwidth bw and the current frequency Fc is supplied from an external controller that 'knows' about the radio's frequency—or the external controller can calculate this and supply a single logic signal to turn on $F_{switch}/2$ tone—either through a communication interface or simply by activating a GPIO input pin. For many applications (for instance, AVRs, MediaPCs, automotive head units, etc.) the AM-radio and the class-D amplifier reside in a single unit with a "global" controller that can control the communication of either Fc or the logic $F_{switch}/2$ turn-on signal. In other applications, the AM-radio and class-D amplifier are in separate units that are still connected by some sort of network connection and in sufficient proximity for the switch tones to influence AM radio reception. Examples of this type of system could be networked active speakers in the home (UPnP on ethernet or WiFi) or separate networked units in a car (MOST system). For these types of systems, a signal indicating the frequency Fc, or a logic signal indicating the need for the $F_{switch}/2$ tone could be transmitted over the network connection.

Referring to FIG. 20, a functional block diagrams illustrating a system in which an amplifier is connected to other audio system components by a network is shown. In this example, a switching amplifier 610 operates as described above to drive a load 620. Amplifier 610 receives the input audio signal from another network component such as an AM radio receiver. Amplifier 610 is configured to receive operating parameters from a controller 630. Controller 630 is coupled to a network receiver 640 which is configured to receive control information via the audio network and to provide this control information to controller 630.

One Implementation of $F_{switch}/2$ Tone

Both the dead time distortion and the AM radio avoidance can be implemented by adding a tone scaled the same type of polynomial:

$$y=x+\text{alpha}*(b4*x^4+b2*x^2+b0)*\text{tone}$$

where x is the input signal, y is the output equal to signal+scaled tone, alpha is a scaling factor and b0, b2 and b4 are polynomial coefficients. Typically, this will be implemented in a combination of custom hardware and a more general DSP-like data path.

The setting of alpha can be controlled by register bits. For example, alpha can be controlled by an 8-bit value in a register, with a unit of 1/128. This allows alpha to be set in the range 0 to 255/128 with a resolution of 1/128.

Typical implementations of digital PWM amplifiers will, as noted above, be a combination of custom hardware and a more general DSP-like data path performing multiply-accumulate type instructions. A tone at $F_{switch}/2$ is simply a sequence of −1, 1, −1, 1 etc. Therefore a scaled version alpha*tone can be generated efficiently in hardware and presented to the data path as "coefficient" PWMtonea. If the tone is represented as a signal 'fs2tone' that alternates between 0 and 1 on every sample, then hardware can generate:

$$PWM\text{tone}a=(fs2\text{tone ? alpha}: -\text{alpha})$$

$$fs2\text{tone}=\sim fs2\text{tone};$$

Given an input signal PWMx, the data path then calculates an output sum PWMy of the signal and scaled tone: The data path then calculates:

$$PWMxx=PWMx*PWMx$$

$$\text{scale}=(b4*PWMxx+b2)*PWMxx+b0$$

$$PWMy=PWMx+\text{scale}*PWM\text{tone}a$$

The values "PWMxx" and "scale" are kept in intermediate storage, so no data registers are required for the $F_{switch}/2$ block.

The coefficients b0-b4 are stored in the coefficients memory.

When using the $F_{switch}/2$ tone to move dead time distortion in 3-level modulation mode, the polynomial P(x)=1−x2 has a value of 1 for x=0 and a value of 0 for x=1 and x=−1, so selecting b4=0, b2=−1 and b0=1 is a good choice. Typically, alpha will be chosen approximately 0.1.

A processor in the amplifier can update the scaling factor alpha and the coefficients b0, b2, and b4 at any time. This can be used to react dynamically to changes in the amplifiers working condition like the volume control, input signal type and strength, clipping in the noises shapers etc. to maintain an optimum balance between the benefits and drawbacks from adding the $F_{switch}/2$ tone.

Referring to FIG. 21, a functional block diagram illustrating the structure of a system employing a monitor in accordance with an alternative embodiment is shown. In this embodiment, a modifier 310 accepts and audio signal and an ultrasonic signal from signal generator 320 as inputs, and generates a modified audio signal based on these inputs. The modified audio signal is provided to modulator 330, which produces pulse with modulated output signals from the modified audio signal. The pulse width modulated signals are in turn used to drive power switches 340. Using these pulse with modulated signals, power switches 340 generate analog audio signals which are used to drive load 350. This system differs from the system shown in FIG. 3, and that a monitor unit 360 is included in the system. Monitor 360 receives information from modulator 330 and power switches 340, and monitors this information to determine whether the ultrasonic signal should be modified or switched on or off. If monitor 360 determines that a change is necessary, the monitor can provide appropriate control signals to modifier 310.

It should be noted that the embodiments described above are intended to be illustrative. Alternative embodiments may implement one or more of the features described above using mechanisms or algorithms other than those described above, or may use different parameters than those used in the foregoing examples. For instance, while some embodiments may add a tone at half the switching frequency, this is not the case in all embodiments, and a tone or tones at other frequencies, or other ultrasonic signals may be used. Similarly, alternative embodiments may be implemented in types of networks not specifically described above, including wired networks, wireless networks, optical networks, power-line networks, CAN networks, IEEE 802.11 networks, Bluetooth networks, Zigbee networks, and the like. Alternative embodiments need not include all of the features described in connection with the foregoing embodiments, such as monitoring radio interference or modifying the added ultrasonic signal by a nonlinear function of the audio signal.

Those of skill in the art will understand that information and signals may be represented using any of a variety of different technologies and techniques. For example, data, information, signals, bits, and the like that may be referenced throughout the above description may be represented by voltages, currents, electromagnetic waves, or the like, including combinations thereof. The information and signals may be communicated between components of the disclosed systems using any suitable transport media, including wires, metallic traces, and so on.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with application specific integrated circuits (ASICs), field programmable gate arrays (FPGAs), general purpose processors, digital signal processors (DSPs) or other logic devices, discrete gates or transistor logic, discrete hardware components, or any combination thereof designed to perform the functions described herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A switching amplifier comprising:
    an ultrasonic signal generator that generates an ultrasonic signal having an ultrasonic frequency;
    a modifier that receives an audio signal and the ultrasonic signal, and that modifies the audio signal in dependence on the ultrasonic signal to thereby generate a modified audio signal;
    a modulator that receives the modified audio signal and that generates a pulse width modulated switching waveform in dependence on the modified audio signal and a carrier signal having a switching frequency Fs that is different than the ultrasonic frequency; and
    power switches that generate an output in dependence on the pulse width modulated switching waveform;
    wherein the modification of the audio signal, in dependence on the ultrasonic signal, results in the generated pulse width modulated switching waveform preventing the power switches from switching simultaneously or nearly simultaneously at low levels of the audio signal, thereby reducing distortion at low levels of the audio signal that would otherwise occur if the power switches switched simultaneously or nearly simultaneously.

2. An amplifier according to claim 1 in which the modifier comprises an adder.

3. A switching amplifier comprising:
    an ultrasonic signal generator that generates an ultrasonic signal having an ultrasonic frequency;
    a modifier that receives an audio signal and the ultrasonic signal, and that modifies the audio signal in dependence on the ultrasonic signal to thereby generate a modified audio signal;
    a modulator that receives the modified audio signal and that generates a pulse width modulated switching waveform in dependence on the modified audio signal; and
    power switches that generate an output in dependence on the pulse width modulated switching waveform;
    wherein the modifier comprises a nonlinear function generator fed in dependence on the audio signal, and a multiplier is configured to multiply the ultrasonic signal by an output of the nonlinear function generator; and wherein the modifier is configured to add the output of the multiplier to the audio signal to thereby generate the modified audio signal.

4. An amplifier according to claim 3 wherein the modifier is configured to reduce the amplitude of the ultrasonic signal when the audio signal has a value close to a maximum value that the amplifier can handle in a substantially linear manner.

5. An amplifier according to claim 1 wherein the switching waveform has the frequency Fs and the ultrasonic signal is a tone having the ultrasonic frequency, which is Fs/2.

6. A switching amplifier comprising:

an ultrasonic signal generator that generates an ultrasonic signal having an ultrasonic frequency;

a modifier that receives an audio signal and the ultrasonic signal, and that modifies the audio signal in dependence on the ultrasonic signal to thereby generate a modified audio signal;

a modulator that receives the modified audio signal and that generates a pulse width modulated switching waveform in dependence on the modified audio signal;

power switches that generate an output in dependence on the pulse width modulated switching waveform; and programmable memory to store a gain coefficient, wherein the modifier is configured to modify the audio signal in dependence on the gain coefficient.

7. A switching amplifier comprising:

an ultrasonic signal generator that generates an ultrasonic signal having an ultrasonic frequency;

a modifier that receives an audio signal and the ultrasonic signal, and that modifies the audio signal in dependence on the ultrasonic signal to thereby generate a modified audio signal;

a modulator that receives the modified audio signal and that generates a pulse width modulated switching waveform in dependence on the modified audio signal;

power switches that generate an output in dependence on the pulse width modulated switching waveform; and a monitor unit configured to provide information to the modifier relating to operation of the amplifier, wherein the modifier adjusts at least one of (a) a gain coefficient that multiplies the ultrasonic signal, and (b) a nonlinear function of the audio signal that multiplies the ultrasonic signal in dependence on the information.

8. An amplifier according to claim 7 wherein the information provided by the monitor unit comprises information relating to at least one of:

(i) a setting of a volume control;

(ii) an input signal type;

(iii) an input signal strength; and (iv) an occurrence of clipping in the amplifier.

9. A switching amplifier comprising:

an ultrasonic signal generator that generates an ultrasonic signal having an ultrasonic frequency;

a modifier that receives an audio signal and the ultrasonic signal, and that modifies the audio signal in dependence on the ultrasonic signal to thereby generate a modified audio signal;

a modulator that receives the modified audio signal and that generates a pulse width modulated switching waveform in dependence on the modified audio signal; and power switches that generate an output in dependence on the pulse width modulated switching waveform;

a noise-shaped quantizer having a noise transfer function;

wherein the ultrasonic signal comprises a tone having the ultrasonic frequency and the noise transfer function has a zero that substantially reduces the noise transfer function at the ultrasonic frequency of the tone.

10. An amplifier according to claim 9, wherein the switching waveform has a frequency Fs and the ultrasonic frequency of the tone is Fs/2.

11. A switching amplifier comprising:

an ultrasonic signal generator that generates an ultrasonic signal having an ultrasonic frequency;

a modifier that receives an audio signal and the ultrasonic signal, and that modifies the audio signal in dependence on the ultrasonic signal to thereby generate a modified audio signal;

a modulator that receives the modified audio signal and that generates a pulse width modulated switching waveform in dependence on the modified audio signal; and power switches that generate an output in dependence on the pulse width modulated switching waveform;

wherein the modifier is enabled or disabled in dependence on one or more signals indicative of whether radiation from the amplifier causes interference with radio reception.

12. An amplifier according to claim 11, further comprising a control input configured to receive the one or more signals indicative of whether radiation from the amplifier causes interference with radio reception.

13. An amplifier according to claim 12, wherein the control input is an electrical input.

14. An amplifier according to claim 12, wherein the control input is a logical bit input.

15. An amplifier according to claim 11, wherein at least one of the one or more signals indicative of whether radiation from the amplifier causes interference with radio reception is also indicative of a frequency received by a radio receiver.

16. An amplifier according to claim 15, wherein at least one of the one or more signals indicative of whether radiation from the amplifier causes interference with radio reception is also indicative of a bandwidth received by the radio receiver.

17. An amplifier according to claim 15, further comprising a radio receiver.

18. An apparatus comprising:

a switching amplifier that uses a switching waveform having a fundamental frequency, the amplifier having at least one operating parameter that is adjustable;

a controller coupled to the amplifier; and a network receiver coupled to the controller and to a network;

wherein the controller is configured to receive messages from the network receiver;

wherein the controller is configured to adjust at least one said operating parameter to reduce an amplitude of signals at the fundamental frequency or at a harmonic of the fundamental frequency in response to the network receiver receiving a message indicating that the amplifier is potentially creating interference with a radio receiver.

19. An apparatus according to claim 18 in which the network comprises at least one of:

a wired network;

a wireless network; and, an optical network.

20. An apparatus according to claim 18 in which the network comprises at least one of:
an Ethernet network;
a Power-line network;
a MOST network;
a CAN network;
an IEEE 802.11 network;
a Bluetooth network; and
a Zigbee network.

21. A method for use with a switching amplifier including power switches, the method comprising:
generating an ultrasonic signal having an ultrasonic frequency;
modifying the audio signal in dependence on the ultrasonic signal to thereby generate a modified audio signal;
generating a pulse width modulated switching waveform in dependence on the modified audio signal and a carrier signal having a switching frequency Fs different than the ultrasonic frequency; and
driving the power switches of the switching amplifier in dependence on the pulse width modulated switching waveform;
wherein the modifying the audio signal, in dependence on the ultrasonic signal, results in the generated pulse width modulated switching waveform preventing the power switches from switching simultaneously or nearly simultaneously at low levels of the audio signal, thereby reducing distortion at low levels of the audio signal that would otherwise occur if the power switches switched simultaneously or nearly simultaneously.

22. A method according to claim 21, wherein the modifying the audio signal, in dependence on the ultrasonic signal, especially reduces coincidence distortion at low signal levels within the amplifier.

23. A method according to claim 21, wherein the modifying the audio signal, in dependence on the ultrasonic signal, also reduces dead time distortion within the amplifier.

24. A method according to claim 21, wherein the modifying the audio signal, in dependence on the ultrasonic signal, also reduces radiation in an AM radio band.

25. A method for use with a switching amplifier including power switches, the method comprising:
generating an ultrasonic signal having an ultrasonic frequency
modifying the audio signal in dependence on the ultrasonic signal to thereby generate a modified audio signal;
generating a pulse width modulated switching waveform in dependence on the modified audio signal; and
driving the power switches of the switching amplifier in dependence on the pulse width modulated switching waveform;
wherein generating the ultrasonic signal comprises generating a tone, wherein the ultrasonic frequency of the tone is half of a switching frequency Fs of the switching amplifier.

26. A method for use with a switching amplifier including power switches, the method comprising:
storing a gain coefficient in a programmable memory;
generating an ultrasonic signal having an ultrasonic frequency;
modifying the audio signal in dependence on the ultrasonic signal to thereby generate a modified audio signal;
generating a pulse width modulated switching waveform in dependence on the modified audio signal; and
driving the power switches of the switching amplifier in dependence on the pulse width modulated switching waveform;
wherein the step of modifying the audio signal in dependence on the ultrasonic signal includes multiplying the ultrasonic signal by the gain coefficient.

27. A method for use with a switching amplifier including power switches, the method comprising:
generating an ultrasonic signal having an ultrasonic frequency;
modifying the audio signal in dependence on the ultrasonic signal to thereby generate a modified audio signal;
generating a pulse width modulated switching waveform in dependence on the modified audio signal; and
driving the power switches of the switching amplifier in dependence on the pulse width modulated switching waveform;
wherein the step of modifying the audio signal in dependence on the ultrasonic signal includes multiplying the ultrasonic signal by a nonlinear function of the audio signal.

28. A method according to claim 27, further comprising reducing a probability of overload in the amplifier by configuring the nonlinear function to decrease when the audio signal reaches a level indicative of the audio signal being large enough to potentially cause overload.

29. A method for use with a switching amplifier including power switches, the method comprising:
generating an ultrasonic signal having an ultrasonic frequency;
modifying the audio signal in dependence on the ultrasonic signal to thereby generate a modified audio signal;
generating a pulse width modulated switching waveform in dependence on the modified audio signal;
driving the power switches of the switching amplifier in dependence on the pulse width modulated switching waveform; and
reducing a probability of clipping or overload by monitoring operation of the amplifier to detect a condition selected from the group consisting of
(a) clipping,
(b) overload,
(c) incipient clipping and
(d) incipient overload; and
adjusting the ultrasonic signal in response to the condition being detected.

30. A method for use with a switching amplifier including power switches, the method comprising:
generating an ultrasonic signal having an ultrasonic frequency;
modifying the audio signal in dependence on the ultrasonic signal to thereby generate a modified audio signal;
generating a pulse width modulated switching waveform in dependence on the modified audio signal; and
driving the power switches of the switching amplifier in dependence on the pulse width modulated switching waveform;
wherein the ultrasonic signal comprises a tone having the ultrasonic frequency;
wherein the method is implemented in an amplifier including a noise-shaped quantizer which has a noise transfer function; and
wherein the method further comprises reducing an audio-frequency intermodulation product between the tone and noise produced by the quantizer by configuring the noise transfer function of the quantizer to have a reduced amplitude at frequencies close to the ultrasonic frequency of the tone.

31. An amplifier according to claim 3, wherein the switching waveform has the frequency Fs and the ultrasonic signal is a tone having the ultrasonic frequency, which is Fs/2.

32. A method according to claim 21, wherein the switching waveform has the frequency Fs and the ultrasonic signal is a tone having the ultrasonic frequency, which is Fs/2.

33. A method according to claim 30, wherein the switching waveform has the frequency Fs and the ultrasonic signal is a tone having the ultrasonic frequency, which is Fs/2.

* * * * *

UNITED STATES PATENT AND TRADEMARK OFFICE
CERTIFICATE OF CORRECTION

| | | |
|---|---|---|
| PATENT NO. | : 7,649,410 B2 | Page 1 of 1 |
| APPLICATION NO. | : 11/626569 | |
| DATED | : January 19, 2010 | |
| INVENTOR(S) | : Jack B. Andersen et al. | |

It is certified that error appears in the above-identified patent and that said Letters Patent is hereby corrected as shown below:

In Claim 25, at Column 15, Line 44, after "quency" insert --;--.

Signed and Sealed this
Twenty-sixth Day of April, 2011

David J. Kappos
*Director of the United States Patent and Trademark Office*